US007670963B2

(12) United States Patent
Ramkumar et al.

(10) Patent No.: US 7,670,963 B2
(45) Date of Patent: Mar. 2, 2010

(54) SINGLE-WAFER PROCESS FOR FABRICATING A NONVOLATILE CHARGE TRAP MEMORY DEVICE

(75) Inventors: Krishnaswamy Ramkumar, San Jose, CA (US); Sagy Levy, Yaakov (IL)

(73) Assignee: Cypress Semiconductor Corportion, San Jose, CA (US)

( * ) Notice: Subject to any disclaimer, the term of this patent is extended or adjusted under 35 U.S.C. 154(b) by 0 days.

(21) Appl. No.: 11/904,513

(22) Filed: Sep. 26, 2007

(65) Prior Publication Data
US 2008/0293254 A1    Nov. 27, 2008

Related U.S. Application Data

(60) Provisional application No. 60/940,128, filed on May 25, 2007.

(51) Int. Cl.
*H01L 21/469* (2006.01)

(52) U.S. Cl. ............... 438/778; 438/287; 438/261; 438/763; 438/591; 438/770; 438/787; 438/791; 438/306; 438/585; 438/786; 438/396; 438/954; 438/761; 438/762; 257/324; 257/326; 257/E29.309; 257/E29.316; 257/E29.331; 257/E21.18; 257/E21.21; 257/E21.423; 257/E21.679; 257/E21.409

(58) Field of Classification Search ............. 438/787, 438/791, 778; 257/E21.24
See application file for complete search history.

(56) References Cited

U.S. PATENT DOCUMENTS

| 5,817,170 | A | 10/1998 | Desu et al. | |
|---|---|---|---|---|
| 6,214,689 | B1 | 4/2001 | Lim et al. | |
| 6,321,134 | B1 * | 11/2001 | Henley et al. | 700/121 |
| 6,444,521 | B1 * | 9/2002 | Chang et al. | 438/257 |
| 6,746,968 | B1 * | 6/2004 | Tseng et al. | 438/770 |
| 7,033,957 | B1 * | 4/2006 | Shiraiwa et al. | 438/770 |
| 7,115,469 | B1 * | 10/2006 | Halliyal et al. | 438/257 |
| 2003/0124873 | A1 * | 7/2003 | Xing et al. | 438/770 |
| 2004/0173918 | A1 | 9/2004 | Kamal et al. | |
| 2006/0111805 | A1 | 5/2006 | Yokoyama et al. | |
| 2007/0051306 | A1 | 3/2007 | Ivanov et al. | |
| 2008/0146042 | A1 * | 6/2008 | Kostamo et al. | 438/778 |

OTHER PUBLICATIONS

International Search Report, PCT/US07/20988 filed Sep. 28, 2007, mailed Mar. 14, 2008.
Written Opinion of the International Searching Authority, PCT/US07/20988 filed Sep. 28, 2007, mailed Mar. 14, 2008.

* cited by examiner

*Primary Examiner*—Fernando L Toledo
*Assistant Examiner*—Ankush K Singal (57) ABSTRACT

A method for fabricating a nonvolatile charge trap memory device is described. The method includes first forming a tunnel dielectric layer on a substrate in a first process chamber of a single-wafer cluster tool. A charge-trapping layer is then formed on the tunnel dielectric layer in a second process chamber of the single-wafer cluster tool. A top dielectric layer is then formed on the charge-trapping layer in the second or in a third process chamber of the single-wafer cluster tool.

8 Claims, 7 Drawing Sheets

SINGLE-WAFER PROCESS FOR FABRICATING A NONVOLATILE CHARGE TRAP MEMORY DEVICE

CROSS REFERENCE TO RELATED APPLICATIONS

This application claims the benefit of U.S. Provisional Application No. 60/940,128, filed May 25, 2007, which is hereby incorporated by reference.

TECHNICAL FIELD

The invention is in the field of Semiconductor Devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Figure 1:
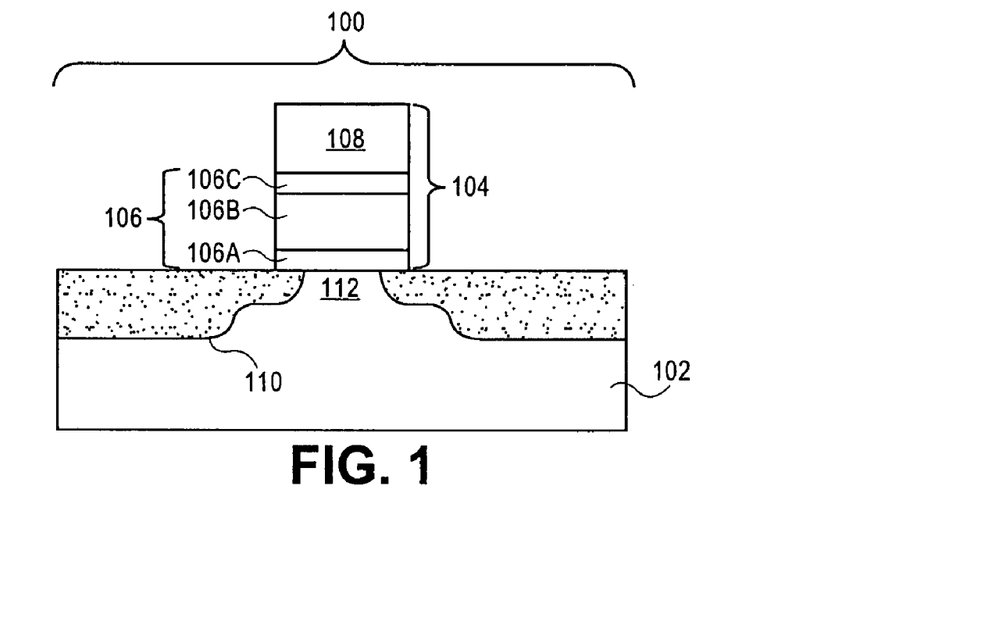
FIG. 1 illustrates a cross-sectional view of a conventional nonvolatile charge trap memory device.

Non-volatile semiconductor memories typically use stacked floating gate type field-effect-transistors. In such transistors, electrons are injected into a floating gate of a memory cell to be programmed by biasing a control gate and grounding a body region of a substrate on which the memory cell is formed. An oxide-nitride-oxide (ONO) stack is used as either a charge storing layer, as in a semiconductor-oxide-nitride-oxide-semiconductor (SONOS) transistor, or as an isolation layer between the floating gate and control gate, as in a split gate flash transistor. FIG. 1 illustrates a cross-sectional view of a conventional nonvolatile charge trap memory device.

Referring to FIG. 1, semiconductor device 100 includes a SONOS gate stack 104 including a conventional ONO portion 106 formed over a silicon substrate 102. Semiconductor device 100 further includes source and drain regions 110 on either side of SONOS gate stack 104 to define a channel region 112. SONOS gate stack 104 includes a poly-silicon gate layer 108 formed above and in contact with ONO portion 106. Poly-silicon gate layer 108 is electrically isolated from silicon substrate 102 by ONO portion 106. ONO portion 106 typically includes a tunnel oxide layer 106A, a nitride or oxy-nitride charge-trapping layer 106B, and a top oxide layer 106C overlying nitride or oxy-nitride layer 106B.

Figure 2:
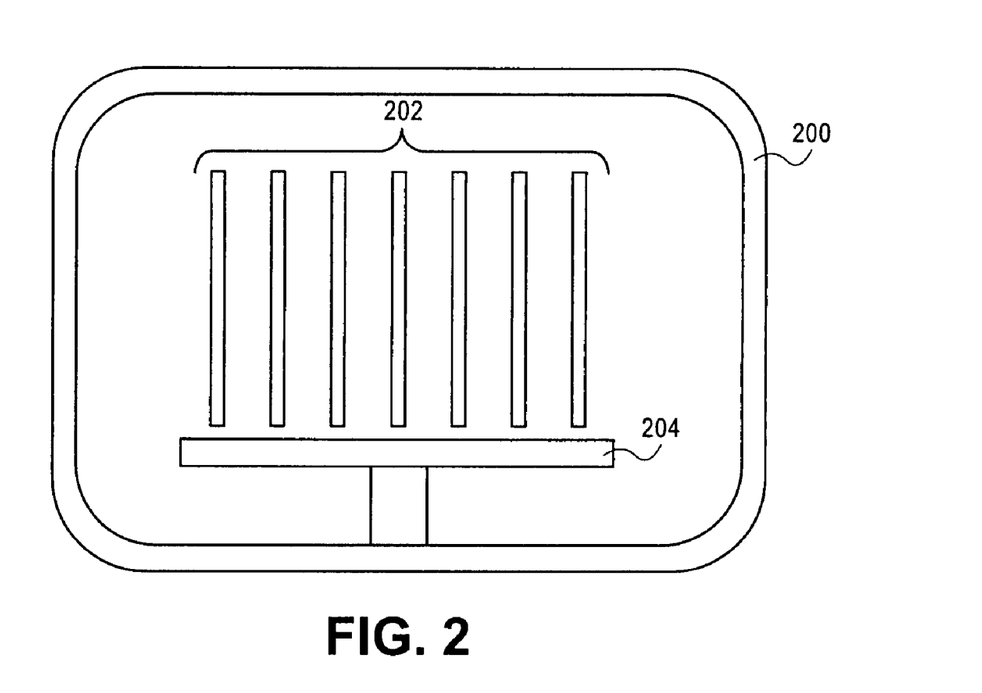
FIG. 2 illustrates a cross-sectional view of a conventional oxidation chamber of a batch-processing tool.

One problem with conventional SONOS transistors is the poor quality tunnel oxide layer 106A obtained when attempting to scale such devices. Batch processing equipment is conventionally used to grow tunnel oxide layer 106A. Such a process may be sufficient for relatively thick tunnel oxide layers. However, attempts to grow a thinner tunnel oxide layer 106A, i.e. to scale tunnel oxide layer 106A, in batch processing equipment has resulted in tunnel oxide layers of unacceptably low quality and/or poor thickness uniformity. FIG. 2 illustrates a cross-sectional view of a conventional oxidation chamber of a batch-processing tool.

Referring to FIG. 2, a batch oxidation chamber 200 includes a carrier device 204 to hold a plurality of semiconductor wafers 202. In growing a tunnel oxide layer on each of the plurality of semiconductor wafers 202, both inter- and intra-wafer tunnel oxide growth variations can occur. These variations can result because the relative arrangement of each wafer of the plurality of semiconductor wafers 202 varies with respect to the coordinates of batch oxidation chamber 200. Furthermore, long temperature ramp times and stabilization times used to heat the plurality of semiconductor wafers 202 in batch oxidation chamber 200 can cut into the thermal budget of the plurality of semiconductor wafers 202. Additionally, batch oxidation chamber 200 is usually restricted to processing temperatures of 800 degrees Celsius or lower.

DETAILED DESCRIPTION

Methods to fabricate a nonvolatile charge trap memory device are described herein. In the following description, numerous specific details are set forth, such as specific dimensions, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is to be understood that the various embodiments shown in the Figures are illustrative representations and are not necessarily drawn to scale.

Disclosed herein is a method to fabricate a nonvolatile charge trap memory device. In an embodiment, a tunnel dielectric layer is formed on a substrate in a first process chamber of a single-wafer cluster tool. A charge-trapping layer may then be formed on the tunnel dielectric layer in a second process chamber of the single-wafer cluster tool. In one embodiment, a top dielectric layer is then formed on the charge-trapping layer in a third process chamber of the single-wafer cluster tool. In an alternative embodiment, the top dielectric layer is formed on the charge-trapping layer in the second process chamber of the single-wafer cluster tool.

Generally, a nonvolatile charge trap memory device including a tunnel dielectric layer formed on a substrate in a single-wafer oxidation chamber may be scaled to smaller dimensions without degrading the performance of the device. In accordance with an embodiment of the present invention, a tunnel dielectric layer is formed on a substrate in a single-wafer oxidation chamber at a higher temperature than achievable in a conventional batch process chamber. The resulting tunnel dielectric layer may therefore be of very high quality, even at a reduced thickness. In one embodiment, the tunnel dielectric layer formed on a substrate in a single-wafer oxidation chamber is denser and is composed of substantially fewer hydrogen atoms/cm$^3$ than a tunnel dielectric layer formed in a batch process chamber. The substrate upon which a tunnel dielectric layer is formed may be exposed to a shorter temperature ramp rate and stabilization time in a single-wafer oxidation chamber than for a batch process chamber. Thus, in accordance with an embodiment of the present invention embodiment, the impact on the thermal budget of the substrate is reduced by using a single-wafer oxidation chamber. A tunnel dielectric layer formed in a single-wafer oxidation chamber may be less susceptible to crystal plane orientation differences in the substrate upon which it is grown. In one embodiment, the cornering effect caused by differential crystal plane oxidation rates is significantly reduced by forming the tunnel dielectric layer in a single-wafer oxidation chamber. By forming all layers of an oxide-nitride-oxide (ONO) stack in a single-wafer cluster tool, interface damage may be reduced between the respective layers. Thus, in accordance with an embodiment of the present invention, an ONO stack is fabricated in a single pass in a single-wafer cluster tool in order to preserve a pristine interface between the layers in the ONO stack.

Figure 3:
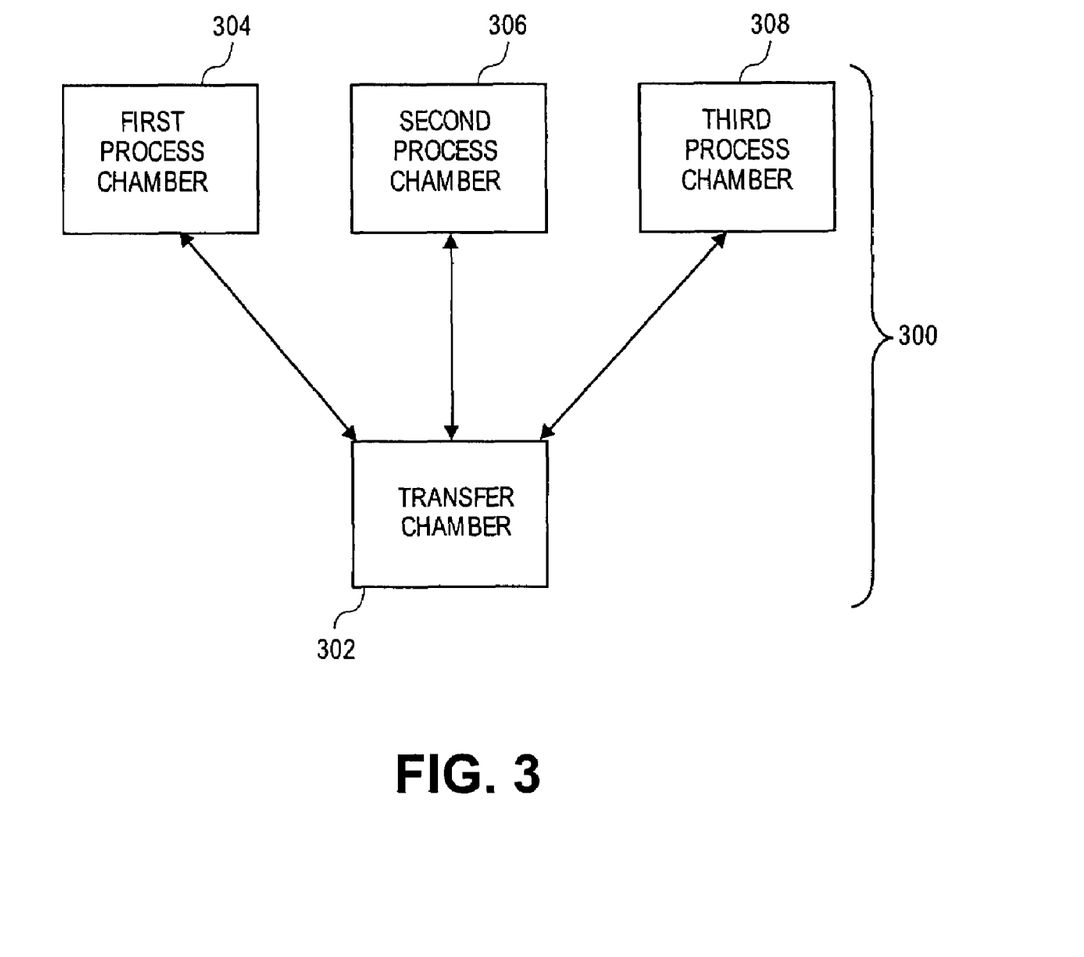
FIG. 3 illustrates an arrangement of process chambers in a single-wafer cluster tool, in accordance with an embodiment of the present invention.

A portion of a nonvolatile charge trap memory device may be fabricated in a single-wafer cluster tool. FIG. 3 illustrates an arrangement of process chambers in a single-wafer cluster tool, in accordance with an embodiment of the present invention. Referring to FIG. 3, an arrangement of process chambers in a single-wafer cluster tool 300 includes a transfer chamber 302, a first process chamber 304, a second process chamber 306 and a third process chamber 308. In an embodiment, transfer chamber 302 is for receiving a wafer from an external environment for introduction into single-wafer cluster tool 300. In one embodiment, each of the process chambers 302, 304 and 306 are arranged in a way such that a wafer may be passed back- and forth between these chambers and transfer chamber 302, as depicted by the double-headed arrows in FIG. 3. In accordance with an additional embodiment of the present invention, although not shown, single-wafer cluster tool 300 may be configured such that a wafer can be transferred directly between process chambers 302, 304 and 306.

Single-wafer cluster tool 300 may be any cluster tool where an outside environment is excluded in and between process chambers 304, 306 and 308 and transfer chamber 302. Thus, in accordance with an embodiment of the present invention, once a wafer has entered process chamber 302, it is protected from an external environment as it is moved into and between process chambers 304, 306 and 308 and transfer chamber 302. An example of such a single-wafer cluster tool is the Centura® platform commercially available from Applied Materials, Inc., located in Santa Clara, Calif. In one embodiment, once a wafer has been received by transfer chamber 302, a vacuum of less than approximately 100 mTorr is maintained in single-wafer cluster tool 300.

Process chambers 302, 304 and 306 may include, but are not limited to, single-wafer oxidation chambers, single-wafer low-pressure chemical vapor deposition chambers, or a combination thereof. For example, in accordance with an embodiment of the present invention, first process chamber 304 is a single-wafer oxidation chamber, second process chamber 306 is a single-wafer low-pressure chemical vapor deposition chamber, and third process chamber 308 is a single-wafer low-pressure chemical vapor deposition chamber. An example of a single-wafer oxidation chamber is the In-Situ Steam Generation (ISSG) chamber from Applied Materials, Inc. Examples of single-wafer low-pressure chemical vapor deposition chambers include a SiNgen™ chamber and an OXYgen™ chamber from Applied Materials, Inc. Instead of heating entire process chambers to heat a wafer, which is the case for typical batch process chambers, a chuck used for carrying a single wafer may be heated to heat the wafer. In accordance with an embodiment of the present invention, a chuck is used to heat a wafer to the desired process temperature. Thus, relatively short temperature ramp times and stabilization times may be achieved.

Figure 4:
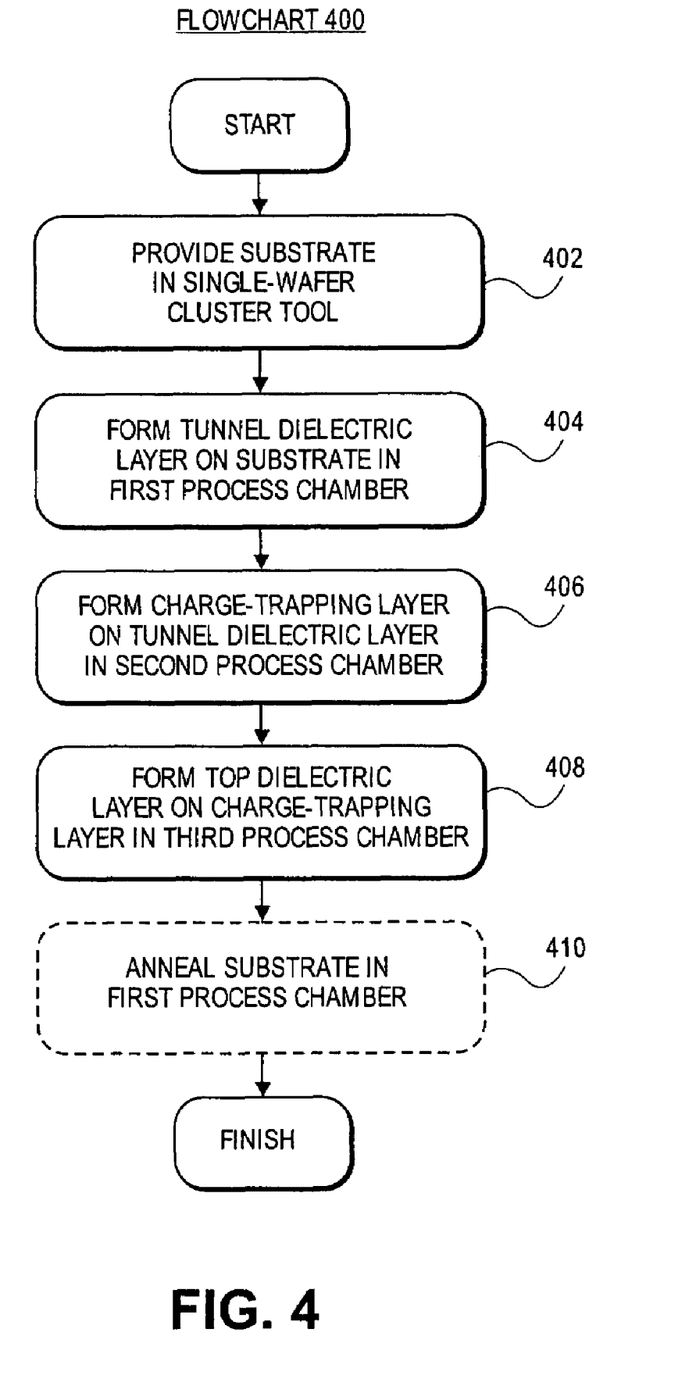
FIG. 4 depicts a Flowchart 400 representing a series of operations in a method for fabricating a nonvolatile charge trap memory device, in accordance with an embodiment of the present invention.
Figure 5A:
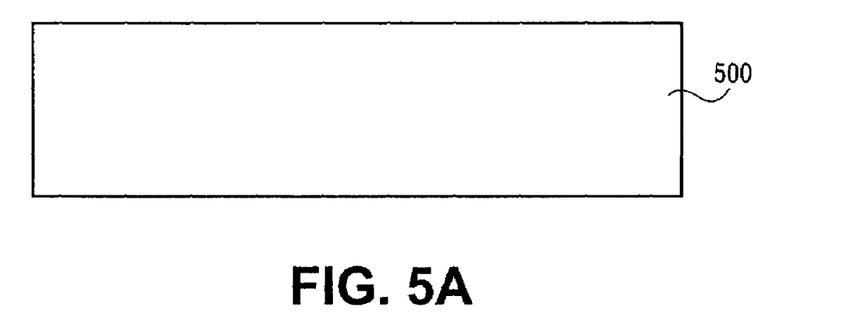
FIG. 5A illustrates a cross-sectional view of a substrate, corresponding to operation 402 from Flowchart 400, in accordance with an embodiment of the present invention.

A portion of a nonvolatile charge trap memory device may be fabricated in a single-wafer cluster tool. FIG. 4 depicts a Flowchart 400 representing a series of operations in a method for fabricating a nonvolatile charge trap memory device, in accordance with an embodiment of the present invention. FIG. 5A illustrates a cross-sectional view of a substrate, corresponding to operation 402 from Flowchart 400, in accordance with an embodiment of the present invention.

Referring to operation 402 of Flowchart 400 and corresponding FIG. 5A, a substrate 500 is provided in a single-wafer cluster tool. In one embodiment, substrate 500 is provided in a transfer chamber, such as transfer chamber 302 described in association with FIG. 3.

Substrate 500 may be composed of any material suitable for semiconductor device fabrication. In one embodiment, substrate 500 is a bulk substrate composed of a single crystal of a material which may include, but is not limited to, silicon, germanium, silicon-germanium or a III-V compound semiconductor material. In another embodiment, substrate 500 includes a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. In another embodiment, substrate 500 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium and a III-V compound semiconductor material. The insulator layer is composed of a material which may include, but is not limited to, silicon dioxide, silicon nitride and silicon oxy-nitride. The lower bulk layer is composed of a single crystal which may include, but is not limited to, silicon, germanium, silicon-germanium, a III-V compound semiconductor material and quartz. Substrate 500 may further include dopant impurity atoms.

Figure 5B:
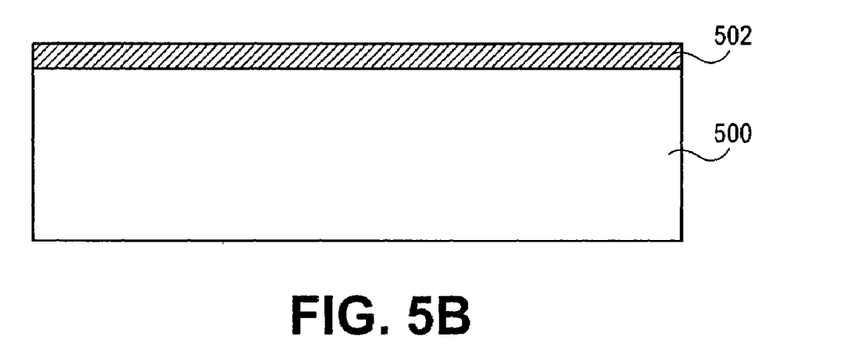
FIG. 5B illustrates a cross-sectional view of a substrate having a tunnel dielectric layer formed thereon, corresponding to operation 404 from Flowchart 400, in accordance with an embodiment of the present invention.

FIG. 5B illustrates a cross-sectional view of a substrate having a tunnel dielectric layer formed thereon, corresponding to operation 404 from Flowchart 400, in accordance with an embodiment of the present invention. Referring to operation 404 of Flowchart 400 and corresponding FIG. 5B, a tunnel dielectric layer 502 is formed on substrate 500 in a first process chamber of a single-wafer cluster tool.

Tunnel dielectric layer 502 may be any material and have any thickness suitable to allow charge carriers to tunnel into the charge-trapping layer under an applied gate bias while maintaining a suitable barrier to leakage when the device is unbiased. In accordance with an embodiment of the present invention, tunnel dielectric layer 502 is formed by a thermal oxidation process wherein the top surface of a silicon wafer is consumed to form tunnel dielectric layer 502. In one embodiment, tunnel dielectric layer 502 is composed of a material such as, but not limited to, silicon dioxide, silicon oxy-nitride, or a combination thereof. In one embodiment, tunnel dielectric layer 502 is formed on substrate 500 in a single-wafer oxidation chamber, such as the single-wafer oxidation chamber described in association with FIG. 3. In a specific embodiment, the first process chamber is a single-wafer oxidation chamber and tunnel dielectric layer 502 is formed at a temperature approximately in the range of 950-1100 degrees Celsius. In another specific embodiment, the first process chamber is a single-wafer oxidation chamber and tunnel dielectric layer 502 is formed by a radical oxidation process using oxygen ($O_2$) and hydrogen ($H_2$) gas at a temperature approximately in the range of 1000-1100 degrees Celsius. In one embodiment, tunnel dielectric layer 502 is formed to a thickness approximately in the range of 1-10 nanometers. In a particular embodiment, tunnel dielectric layer 502 is formed to a thickness approximately in the range of 1.5-2.5 nanometers. In accordance with an embodiment of the present invention, tunnel dielectric layer 502 is formed as a high-density, low-hydrogen-content film.

Subsequent to forming tunnel dielectric layer 502, but prior to any further processing, tunnel dielectric layer 502 may be subjected to a nitridation process. In one embodiment, the nitridation occurs in the first process chamber. In accordance with an embodiment of the present invention, subsequent to forming tunnel dielectric layer 502 and prior to forming a charge-trapping layer, substrate 500 is annealed in the first process chamber, wherein the annealing includes heating substrate 500 in an atmosphere including nitrogen at a temperature approximately in the range of 900-1100 degrees Celsius for a duration approximately in the range of 30 seconds-60 seconds. In one embodiment, the atmosphere including nitrogen is composed of a gas such as, but not limited to, nitrogen ($N_2$), nitrous oxide ($N_2O$), nitrogen dioxide ($NO_2$), nitric oxide (NO) and ammonia ($NH_3$). In another embodiment, the nitridation occurs in a separate process chamber. Alternatively, this nitridation step may be skipped.

Figure 5C:
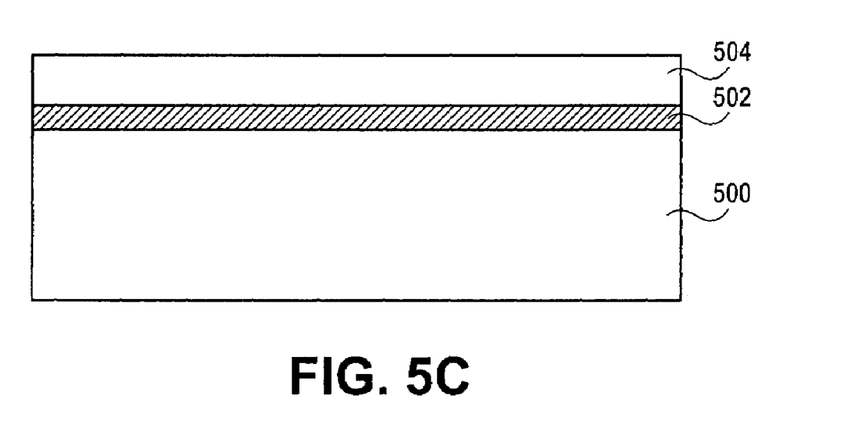
FIG. 5C illustrates a cross-sectional view of a substrate having a charge-trapping layer formed thereon, corresponding to operation 406 from Flowchart 400, in accordance with an embodiment of the present invention.

FIG. 5C illustrates a cross-sectional view of a substrate having a charge-trapping layer formed thereon, corresponding to operation 406 from Flowchart 400, in accordance with an embodiment of the present invention. Referring to operation 406 of Flowchart 400 and corresponding FIG. 5C, a charge-trapping layer 504 is formed on tunnel dielectric layer 502 in a second process chamber of a single-wafer cluster tool.

Charge-trapping layer 504 may be composed of any material and have any thickness suitable to store charge and, hence, change the threshold voltage of a gate stack. In accordance with an embodiment of the present invention, charge-trapping layer 504 is formed by a chemical vapor deposition process and is composed of a material such as, but not limited to, silicon nitride, silicon oxy-nitride, and variable stoichiometries thereof. In one embodiment, charge-trapping layer 504 is formed on tunnel dielectric layer 502 in a single-wafer low-pressure chemical vapor deposition chamber, such as the SiNgen™ single-wafer low-pressure chemical vapor deposition chamber described in association with FIG. 3. In a specific embodiment, the second process chamber is a single-wafer low-pressure chemical vapor deposition chamber and charge-trapping layer 504 is formed at a temperature less than the temperature used to form tunnel dielectric layer 502. In another specific embodiment, the second process chamber is a single-wafer low-pressure chemical vapor deposition chamber and charge-trapping layer 504 is formed at a temperature approximately in the range of 700-850 degrees Celsius. In another specific embodiment, the second process chamber is a single-wafer low-pressure chemical vapor deposition chamber and charge-trapping layer 504 is formed at a temperature approximately in the range of 750-780 degrees Celsius and has an improved charge-retention capacity. In a particular embodiment, the second process chamber is a single-wafer low-pressure chemical vapor deposition chamber and charge-trapping layer 504 is formed by using gases such as, but not limited to, dichlorosilane ($H_2SiCl_2$), bis-(tert-butylamino)silane (BTBAS), ammonia ($NH_3$) and nitrous oxide ($N_2O$). In one embodiment, charge-trapping layer 504 is formed to a thickness approximately in the range of 8-10 nanometers.

Alternatively, charge-trapping layer 504 may include multiple composition regions. For example, in accordance with an embodiment of the present invention, charge-trapping layer 504 includes an oxygen-rich portion and a silicon-rich portion and is formed by depositing an oxygen-rich oxy-nitride film by a first composition of gases in the second process chamber and, subsequently, depositing a silicon-rich oxy-nitride film by a second composition of gases in the second process chamber. In one embodiment, charge-trapping layer 504 is formed by modifying the flow rate of ammonia ($NH_3$) gas, and introducing nitrous oxide ($N_2O$) and dichlorosilane ($SiH_2Cl_2$) to provide the desired gas ratios to yield first an oxygen-rich oxy-nitride film and then a silicon-rich oxy-nitride film. In a specific embodiment, the oxygen-rich oxy-nitride film is formed by introducing a process gas including $N_2O$, $NH_3$ and $SiH_2Cl_2$, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In a further embodiment, the process gas can include a gas mixture of $N_2O$ and $NH_3$ mixed in a ratio of from about 8:1 to about 1:8 and $SiH_2Cl_2$ and $NH_3$ mixed in a ratio of from about 1:7 to about 7:1, and can be introduced at a flow rate of from about 5 to about 200 standard cubic centimeters per minute (sccm). In another specific embodiment, the silicon-rich oxy-nitride film is formed by introducing a process gas including $N_2O$, $NH_3$ and $SiH_2Cl_2$, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In a further embodiment, can include a gas mixture of $N_2O$ and $NH_3$ mixed in a ratio of from about 8:1 to about 1:8 and $SiH_2Cl_2$ and $NH_3$ mixed in a ratio of from about 1:7 to about 7:1, introduced at a flow rate of from about 5 to about 20 sccm.

Additionally, in forming charge-trapping layer 504 having multiple composition regions, an anneal step may be carried out between the deposition of the oxygen-rich oxy-nitride film and the deposition of the silicon-rich oxy-nitride film. In an embodiment, this anneal step is possible because the oxygen-rich oxy-nitride film is maintained in the environment within the single-wafer tool and thus retains a pristine surface. In one embodiment, charge-trapping layer 504 is formed by first depositing an oxygen-rich oxy-nitride film in the second process chamber, then annealing the oxygen-rich oxy-nitride film in the first process chamber and, finally, depositing a silicon-rich oxy-nitride film in the second process chamber. This ordering of steps may be used in the case where the second process chamber is a single-wafer low-pressure chemical vapor deposition chamber maintained at non-optimal temperatures for the anneal step, such as the optimal temperatures maintained in the first process chamber. In a specific embodiment, the annealing includes heating in an atmosphere including nitrogen at a temperature approximately in the range of 900-1100 degrees Celsius for a duration approximately in the range of 30 seconds-60 seconds. In a particular embodiment, the atmosphere including nitrogen is composed of a gas such as, but not limited to, nitrogen ($N_2$), nitrous oxide ($N_2O$), nitrogen dioxide ($NO_2$), nitric oxide (NO) and ammonia ($NH_3$).

Figure 5D:
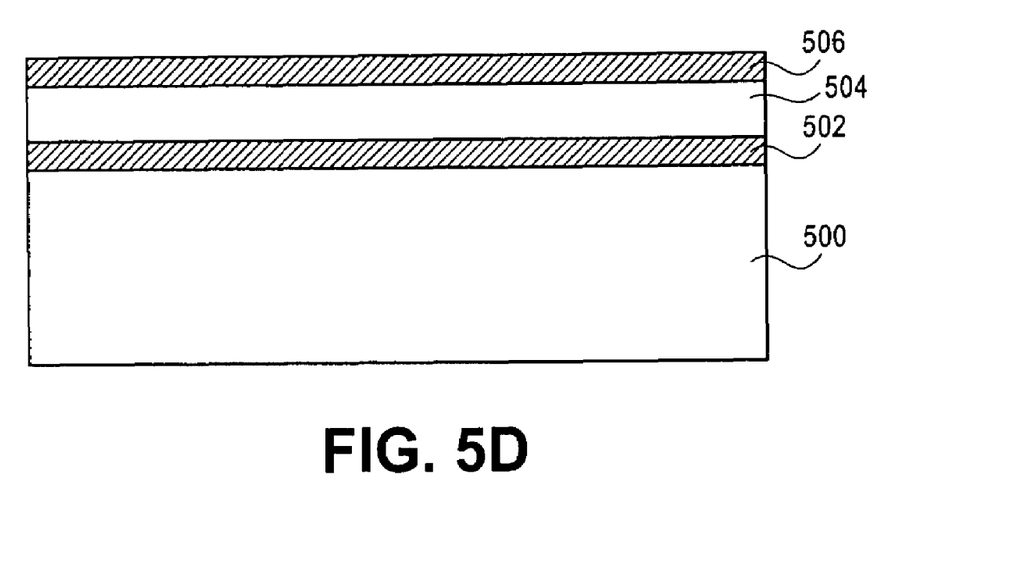
FIG. 5D illustrates a cross-sectional view of a substrate having a top dielectric layer formed thereon, corresponding to operation 408 from Flowchart 400, in accordance with an embodiment of the present invention.

FIG. 5D illustrates a cross-sectional view of a substrate having a top dielectric layer formed thereon, corresponding to operation 408 from Flowchart 400, in accordance with an embodiment of the present invention. Referring to operation 408 of Flowchart 400 and corresponding FIG. 5D, a top dielectric layer 506 is formed on charge-trapping layer 504 in a third process chamber of a single-wafer cluster tool.

Top dielectric layer 506 may be composed of any material and have any thickness suitable to maintain a barrier to charge leakage without significantly decreasing the capacitance of a gate stack. In accordance with an embodiment of the present invention, top dielectric layer 506 is formed by a chemical vapor deposition process and is composed of a material such as, but not limited to, silicon dioxide, silicon oxy-nitride, or a combination thereof. In one embodiment, charge-trapping layer 504 is formed on tunnel dielectric layer 502 in a single-wafer low-pressure chemical vapor deposition chamber, such as the OXYgen™ single-wafer low-pressure chemical vapor deposition chamber described in association with FIG. 3. In a specific embodiment, the third process chamber is a single-wafer low-pressure chemical vapor deposition chamber and top dielectric layer 506 is formed at a temperature approximately in the range of 800-850 degrees Celsius. In a particular embodiment, the third process chamber is a single-wafer low-pressure chemical vapor deposition chamber and top dielectric layer 506 is formed by using gases such as, but not limited to, dichlorosilane ($H_2SiCl_2$) and nitrous oxide ($N_2O$). In one embodiment, top dielectric layer 506 has a thickness approximately in the range of 4-5 nanometers.

Thus, in accordance with an embodiment of the present invention, an ONO stack including tunnel dielectric layer 502, charge-trapping layer 504 and top dielectric layer 506 is formed in a single pass in a single-wafer cluster tool. By fabricating the ONO stack in a single pass in the single-wafer cluster tool, pristine interfaces between tunnel dielectric layer 502 and charge-trapping layer 504 and between charge-trapping layer 504 and top dielectric layer 506 may be preserved. In one embodiment, tunnel dielectric layer 502, charge-trapping layer 504 and top dielectric layer 506 are formed without breaking vacuum in the single-wafer cluster tool. In one embodiment, each layer is formed at a different temperature to tailor film properties without incurring significant ramp time penalties. Furthermore, by fabricating the ONO stack in a single-wafer cluster tool as opposed to fabricating in batch processing tools, the overall uniformity of the ONO stack may be optimized. For example, in accordance with an embodiment of the present invention, by fabricating the ONO stack in a single-wafer cluster tool as opposed to fabricating in batch processing tools, the variability in thickness of the ONO stack across a single wafer may be reduced by as much as approximately 30%. In an exemplary embodiment, $1\sigma$ is approximately in the range of 1-2% of the thickness of tunnel dielectric layer 502.

Referring to operation 410 of Flowchart 400, subsequent to forming top dielectric layer 506, but prior to removing substrate 500 from the single-wafer cluster tool, the ONO stack may be further subjected to a nitridation process in the first process chamber. In accordance with an embodiment of the present invention, subsequent to forming top dielectric layer 506 in the third process chamber, substrate 500 is annealed in the first process chamber, wherein the annealing includes heating substrate 500 in an atmosphere including nitrogen at a temperature approximately in the range of 900-1100 degrees Celsius for a duration approximately in the range of 30 seconds-60 seconds. In one embodiment, the atmosphere including nitrogen is composed of a gas such as, but not limited to nitrogen ($N_2$), nitrous oxide ($N_2O$), nitrogen dioxide ($NO_2$), nitric oxide (NO) and ammonia ($NH_3$). Alternatively, this nitridation step, i.e. operation 410 from Flowchart 400, may be skipped and the wafer unloaded from the single-wafer cluster tool.

Figure 5E:
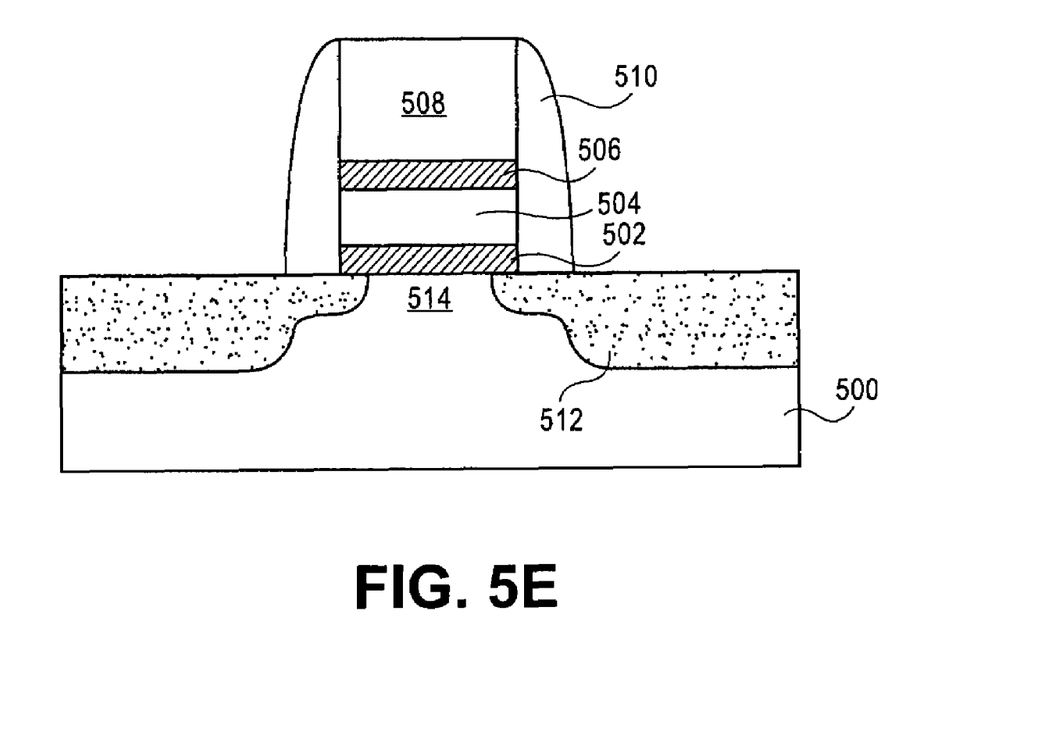
FIG. 5E illustrates a cross-sectional view of a nonvolatile charge trap memory device, in accordance with an embodiment of the present invention.

Upon fabrication of the ONO stack including tunnel dielectric layer 502, charge-trapping layer 504 and top dielectric layer 506, a nonvolatile charge trap memory device may be fabricated to include a patterned portion of the ONO stack. FIG. 5E illustrates a cross-sectional view of a nonvolatile charge trap memory device, in accordance with an embodiment of the present invention.

Referring to FIG. 5E, a nonvolatile charge trap memory device includes a patterned portion of the ONO stack formed over a substrate 500. The ONO stack includes tunnel dielectric layer 502, charge-trapping layer 504 and top dielectric layer 506. A gate layer 508 is disposed on top dielectric layer 506. The nonvolatile charge trap memory device further includes source and drain regions 512 in substrate 500 on either side of the ONO stack, defining a channel region 514 in substrate 500 underneath the ONO stack. A pair of dielectric spacers 510 isolates the sidewalls of tunnel dielectric layer 502, charge-trapping layer 504, top dielectric layer 506 and gate layer 508. In a specific embodiment, channel region 514 is doped P-type and, in an alternative embodiment, channel region 514 is doped N-type.

In accordance with an embodiment of the present invention, the nonvolatile charge trap memory device is a SONOS-type device wherein charge-trapping layer 504 is an insulating layer. By convention, SONOS stands for "Semiconductor-Oxide-Nitride-Oxide-Semiconductor," where the first "Semiconductor" refers to the channel region material, the first "Oxide" refers to the tunnel dielectric layer, "Nitride" refers to the charge-trapping dielectric layer, the second "Oxide" refers to the top dielectric layer (also known as a blocking dielectric layer) and the second "Semiconductor" refers to the gate layer. A SONOS-type device, however, is not limited to these specific materials, as described herein.

Gate layer 508 may be composed of any conductor or semiconductor material suitable for accommodating a bias during operation of a SONOS-type transistor. In accordance with an embodiment of the present invention, gate layer 508 is formed by a chemical vapor deposition process and is composed of doped poly-crystalline silicon. In another embodiment, gate layer 508 is formed by physical vapor deposition and is composed of a metal-containing material which may include, but is not limited to, metal nitrides, metal carbides, metal suicides, hafnium, zirconium, titanium, tantalum, aluminum, ruthenium, palladium, platinum, cobalt and nickel.

Source and drain regions 512 in substrate 500 may be any regions having opposite conductivity to channel region 514. For example, in accordance with an embodiment of the present invention, source and drain regions 512 are N-type doped regions while channel region 514 is a P-type doped region. In one embodiment, substrate 500 and, hence, channel region 514, is composed of boron-doped single-crystal silicon having a boron concentration in the range of $1\times10^{15}$-$1\times10^{19}$ atoms/cm$^3$. Source and drain regions 512 are composed of phosphorous- or arsenic-doped regions having a concentration of N-type dopants in the range of $5\times10^{16}$-$5\times10^{19}$ atoms/cm$^3$. In a specific embodiment, source and drain regions 512 have a depth in substrate 500 in the range of 80-200 nanometers. In accordance with an alternative embodiment of the present invention, source and drain regions 512 are P-type doped regions while channel region 514 is an N-type doped region.

Figure 6:
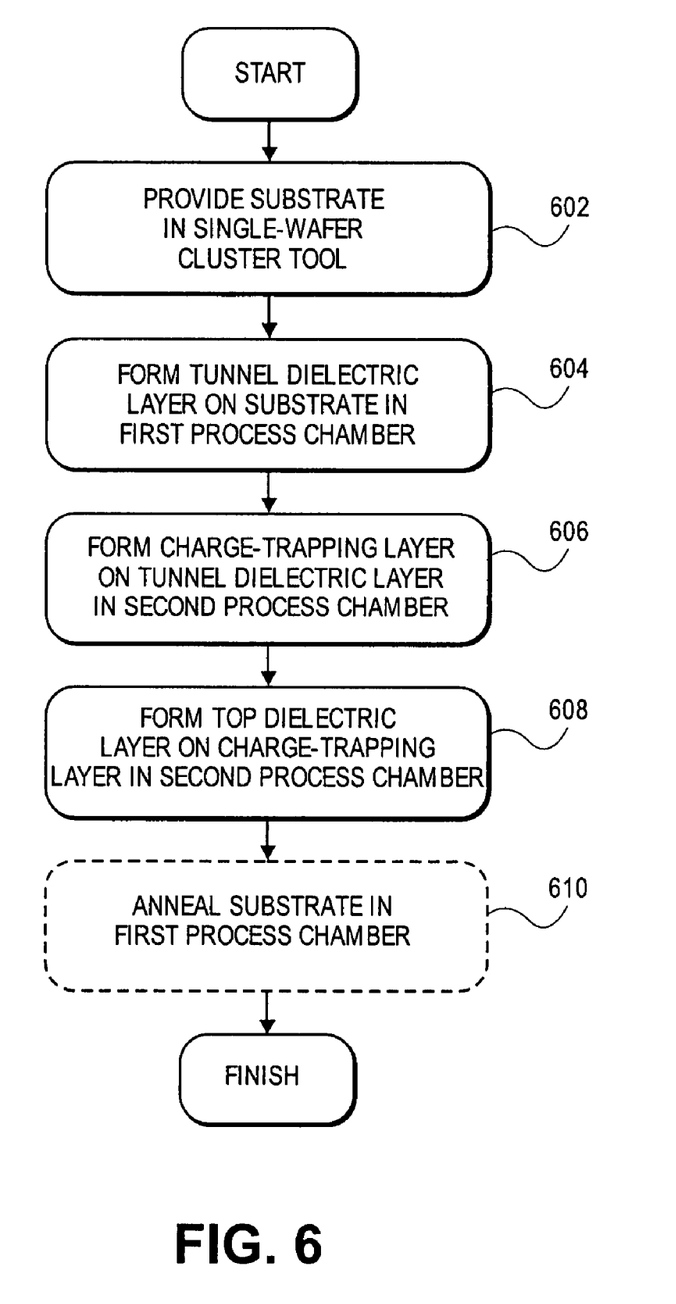
FIG. 6 depicts a Flowchart 600 representing a series of operations in a method for fabricating a nonvolatile charge trap memory device, in accordance with an embodiment of the present invention.

In another embodiment of the present invention, a portion of a nonvolatile charge trap memory device may be fabricated in a single-wafer cluster tool using only two process chambers. FIG. 6 depicts a Flowchart 600 representing a series of operations in a method for fabricating a nonvolatile charge trap memory device, in accordance with an embodiment of the present invention.

Referring to Flowchart 600, operations 602, 604, 606 and 610 correspond with operations 402, 404, 406 and 410, respectively, described above in association with Flowchart 400. However, in accordance with an embodiment of the present invention, operation 608 includes forming a top dielectric layer in the same process chamber as was used to form the charge-trapping layer in operation 606. Thus, in one embodiment, a tunnel dielectric layer is formed on a substrate in a first process chamber, a charge-trapping layer is formed on the tunnel dielectric layer in a second process chamber and a top dielectric layer is formed on the charge-trapping layer in the second process chamber. In a specific embodiment, the first process chamber is a single-wafer oxidation chamber and the second process chamber is a single-wafer low-pressure chemical vapor deposition chamber.

Figure 7A:
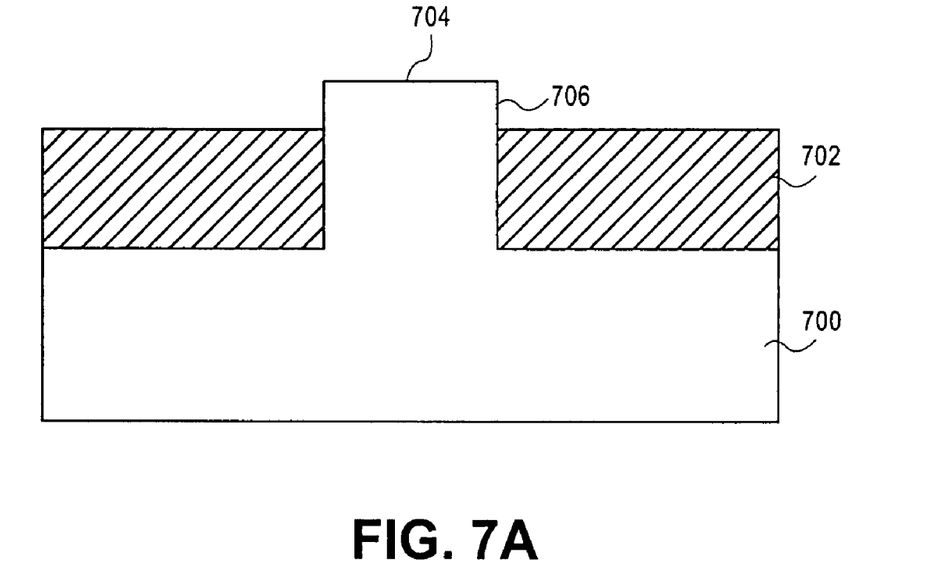
FIG. 7A illustrates a cross-sectional view of a substrate including first and second exposed crystal planes, in accordance with an embodiment of the present invention.

A tunnel dielectric layer formed by oxidation of the top surface of a substrate in a single-wafer oxidation chamber may be less susceptible to crystal plane orientation differences in the substrate upon which it is grown. In accordance with an embodiment of the present invention, the cornering effect caused by differential crystal plane oxidation rates is significantly reduced by forming the tunnel dielectric layer in a single-wafer oxidation chamber. FIG. 7A illustrates a cross-sectional view of a substrate including first and second exposed crystal planes, in accordance with an embodiment of the present invention.

Referring to FIG. 7A, a substrate 700 has isolation regions 702 formed thereon. An exposed portion of substrate 700 extends above the top surface of isolation regions 702. Substrate 700 may be composed of any material and have any property described in association with substrate 500 from FIG. 5A. Isolation regions 702 may be composed of any insulating material compatible for adhesion with substrate 700. In accordance with an embodiment of the present invention, the exposed portion of substrate 700 has a first exposed crystal plane 704 and a second exposed crystal plane 706. In one embodiment, the crystal orientation of first exposed crystal plane 704 is different from the crystal orientation of second exposed crystal plane 706. In a specific embodiment, first exposed crystal plane 704 has <100> orientation and second exposed crystal plane 706 has <110> orientation.

Figure 7B:
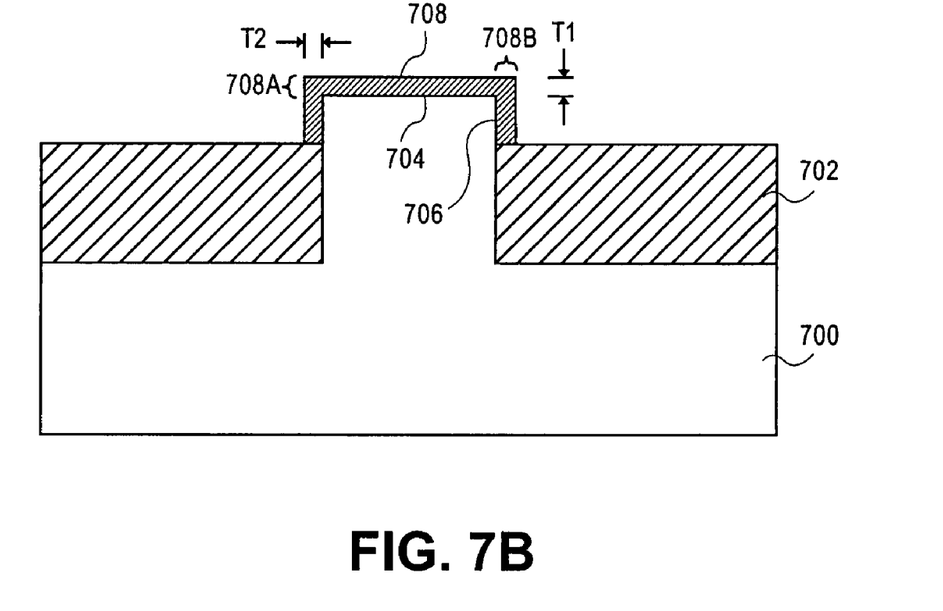
FIG. 7B illustrates a cross-sectional view of the substrate including first and second crystal planes and having a tunnel dielectric layer formed thereon, in accordance with an embodiment of the present invention.

Substrate 700 may be heated in a single-wafer oxidation chamber in an atmosphere including oxygen to form a tunnel dielectric layer by consuming the top surface of substrate 700. FIG. 7B illustrates a cross-sectional view of substrate 700 including first and second crystal planes 704 and 706, respectively, and having a tunnel dielectric layer 708 formed thereon, in accordance with an embodiment of the present invention. In an embodiment, first portion 708A of tunnel dielectric layer 708 is formed on first exposed crystal plane 704 and a second portion 708B of tunnel dielectric layer 708 is formed on second exposed crystal plane 706, as depicted in FIG. 7B. In one embodiment, the thickness T1 of first portion 708A of tunnel dielectric layer 708 is approximately equal to the thickness T2 of second portion 708B of tunnel dielectric layer 708, even though the crystal plane orientation of first exposed crystal plane 704 and second exposed crystal plane 706 differ. In a specific embodiment, the heating of substrate 700 is carried out at a temperature approximately in the range of 950-1100 degrees Celsius. In one embodiment, subsequent to forming tunnel dielectric layer 708, substrate 700 is annealed in the single-wafer oxidation chamber in an atmosphere including nitrogen at a temperature approximately in the range of 900-1100 degrees Celsius for a duration approximately in the range of 30 seconds-60 seconds.

Thus, a method for fabricating a nonvolatile charge trap memory device has been disclosed. A tunnel dielectric layer may be formed on a substrate in a first process chamber of a single-wafer cluster tool. In one embodiment, a charge-trapping layer is formed on the tunnel dielectric layer in a second process chamber of the single-wafer cluster tool. A top dielectric layer may then be formed on the charge-trapping layer in the second process chamber or in a third process chamber of the single-wafer cluster tool.

What is claimed is:

1. A method of fabricating a nonvolatile charge trap memory device, comprising:
   forming, in a first process chamber of a single-wafer cluster tool, a tunnel dielectric layer on a substrate;
   forming, in a second process chamber of the single-wafer cluster tool, a charge-trapping layer on the tunnel dielectric layer, wherein forming the charge-trapping layer comprises:
      depositing an oxygen-rich oxy-nitride film by a first composition of gases in the second process chamber; and, subsequently,
      depositing a silicon-rich oxy-nitride film by a second composition of gases in the second process chamber; and
   forming, in a third process chamber of the single-wafer cluster tool, a top dielectric layer on the charge-trapping layer.

2. The method of claim 1 wherein the first process chamber is an oxidation chamber, and wherein the tunnel dielectric layer is formed at a temperature approximately in the range of 950-1100 degrees Celsius.

3. The method of claim 1, further comprising:
   subsequent to forming the tunnel dielectric layer and prior to forming the charge-trapping layer, annealing the substrate in the first process chamber, wherein the annealing comprises heating the substrate in an atmosphere comprising nitrogen at a temperature approximately in the range of 900-1100 degrees Celsius for a duration approximately in the range of 30 seconds 60 seconds.

4. The method of claim 1 wherein the tunnel dielectric layer, the charge-trapping layer and the top dielectric layer are formed without breaking vacuum in the single-wafer cluster tool.

5. The method of claim 2 wherein the second process chamber is a low-pressure chemical vapor deposition chamber, wherein the charge-trapping layer is formed at a temperature approximately in the range of 700-850 degrees Celsius, wherein the third process chamber a low-pressure chemical vapor deposition chamber, and wherein the top dielectric layer is formed at a temperature approximately in the range of 800-850 degrees Celsius.

6. The method of claim 5 wherein the charge-trapping layer comprises a material selected from the group consisting of silicon nitride and silicon oxy-nitride.

7. The method of claim 5 wherein the top dielectric layer comprises a material selected from the group consisting of silicon dioxide and silicon oxy-nitride.

8. The method of claim 3, further comprising:

subsequent to forming the top dielectric layer, annealing the substrate in the first process chamber, wherein the annealing comprises heating the substrate in an atmosphere comprising nitrogen at a temperature approximately in the range of 900-1100 degrees Celsius for a duration approximately in the range of 30 seconds-60 seconds.

* * * * *